United States Patent
Yoshihara et al.

(10) Patent No.: US 9,134,076 B2
(45) Date of Patent: Sep. 15, 2015

(54) RADIATOR AND METHOD OF MANUFACTURING RADIATOR

(75) Inventors: Hiroyuki Yoshihara, Tokyo (JP); Masaki Goto, Tokyo (JP); Toru Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 584 days.

(21) Appl. No.: 13/510,162

(22) PCT Filed: Nov. 17, 2009

(86) PCT No.: PCT/JP2009/006141
§ 371 (c)(1),
(2), (4) Date: May 16, 2012

(87) PCT Pub. No.: WO2011/061779
PCT Pub. Date: May 26, 2011

(65) Prior Publication Data
US 2012/0227952 A1  Sep. 13, 2012

(51) Int. Cl.
*F28F 3/02* (2006.01)
*B23P 11/00* (2006.01)
(Continued)

(52) U.S. Cl.
CPC . *F28F 3/02* (2013.01); *B23P 11/00* (2013.01); *H01L 21/4878* (2013.01); *H01L 21/4882* (2013.01); *H01L 23/3672* (2013.01);
(Continued)

(58) Field of Classification Search
CPC .............. F28F 2215/00; F28F 2275/12; F28F 2275/122; F28F 3/02; F28D 2021/0029; H01L 23/3672; H01L 21/4878; H01L 21/4882; B23P 11/00; B23P 2700/10; Y10T 29/4935
USPC .................... 165/80.3, 185, 78; 361/703, 704
See application file for complete search history.

(56) References Cited

U.S. PATENT DOCUMENTS 6,062,301 A * 5/2000 Lu ................................ 165/80.3
6,758,262 B2 * 7/2004 Kawabata et al. ........... 165/80.3
(Continued)

FOREIGN PATENT DOCUMENTS

CN  1263123 C   7/2006
DE  10056387 A1 * 5/2002
(Continued)

OTHER PUBLICATIONS

International Search Report dated Jan. 19, 2010 issued in International Application No. PCT/JP2010/006141 (PCT/ISA/210).
(Continued)

*Primary Examiner* — Tho V Duong
*Assistant Examiner* — Aaron Isenstadt
(74) *Attorney, Agent, or Firm* — Sughrue Mion, PLLC

(57) ABSTRACT

A radiator including: a plurality of radiation fins; and a radiation fin support base having a heater element mounted to one surface thereof and a plurality of parallel fin grooves to which the radiation fins are installed and a projection configured to fix the radiation fin formed to the other surface thereof, wherein a top of the projection pushes one side surface of the radiation fin to push the other side surface of the radiation fin toward a side surface of the fin groove, and wherein the fin groove and the projection are each divided in a plurality of pieces in a longitudinal direction of the fin groove, and each of the divided fin grooves and each of the divided projections have a same length in the longitudinal direction of the fin groove and are paired with each other.

2 Claims, 11 Drawing Sheets

(51) Int. Cl.
  *H01L 21/48* (2006.01)
  *H01L 23/367* (2006.01)
  *B21D 53/02* (2006.01)
  *H01L 23/00* (2006.01)

(52) U.S. Cl.
  CPC ............ *B23P2700/10* (2013.01); *H01L 24/48* (2013.01); *H01L 2224/451* (2013.01); *H01L 2224/48247* (2013.01); *H01L 2924/1305* (2013.01); *H01L 2924/13055* (2013.01); *H01L 2924/13091* (2013.01); *Y10T 29/4935* (2015.01)

(56) References Cited

U.S. PATENT DOCUMENTS

| | | | |
|---|---|---|---|
| 7,009,290 B2 * | 3/2006 | Bock et al. | 257/712 |
| 2002/0070005 A1 | 6/2002 | Kawabata et al. | |
| 2004/0190260 A1 * | 9/2004 | Sasaki | 361/704 |
| 2007/0029068 A1 | 2/2007 | Cheng et al. | |

FOREIGN PATENT DOCUMENTS

| | | |
|---|---|---|
| JP | 57209729 A | 12/1982 |
| JP | 06315731 A | 11/1994 |
| JP | 07161882 A | 6/1995 |
| JP | 3033066 U | 10/1996 |
| JP | 11090560 A | 4/1999 |
| JP | 2001102786 A | 4/2001 |
| JP | 2002299864 A | 10/2002 |
| WO | 02/41677 A2 | 5/2002 |
| WO | 2008/123488 A1 | 10/2008 |

OTHER PUBLICATIONS

Written Opinion dated Jan. 19, 2010 issued in International Application No. PCT/JP2010/006141 (PCT/ISA/237).
Communication dated Dec. 13, 2013, issued by the European Patent Office in corresponding Application No. 09851406.0.
Office Action dated Nov. 12, 2012 issued by the Taiwanese Patent Office in counterpart Taiwanese Patent Application No. 099100062.
English-Language Translation for an Office Action dated Nov. 12, 2012 issued by the Taiwanese Patent Office in counterpart Taiwanese Patent Application No. 099100062.

* cited by examiner (a)

(b)

(a)

(b)

(c)

(a)

(b)

(a)

(b)

(c)

RADIATOR AND METHOD OF MANUFACTURING RADIATOR

TECHNICAL FIELD

The present invention particularly relates to a radiator that is sealed by resin, among radiators each cooling a heater element for use in various devices including a power converter, and a method of manufacturing the radiator.

BACKGROUND ART

Up to now, as a radiator that cools the heater element, heat sinks have been generally widely used. The heat sinks are roughly classified into one heat sink in which radiation fins and a radiation fin support base are integrated together by die cast molding or extrusion molding, and another heat sink in which the radiation fins and the radiation fin support base are individualized and combined together. In the latter, by the radiation fins and the radiation fin support base being individualized, a restriction of strength of a die necessary for the extrusion molding or the die cast molding can be relaxed, and therefore, a fin pitch between the adjacent radiation fins can be narrowed or a radiation fin length can be lengthened. Accordingly, as compared with the former, the latter is effective in reducing costs attributable to a reduction in an installation area of a semiconductor device or a reduction in a size of the heater element.

Also, there is a swaging method as a method of fitting the radiation fins with the radiation fin support base in a configuration where the radiation fins and the radiation fin support base are individualized and combined together. As this method, for example, Patent Literature 1 discloses a radiator in which plural grooves are formed in parallel to a plane of the radiation fin support base in advance, side edges of the radiation fins are fixed with the grooves from above, and a tip of a swaging tool is pushed against plural different grooves each formed between the plural adjacent grooves to forcedly narrow the grooves fixed with the side edges of the radiation fins.

Also, Patent Literature 2 discloses a technique by which the grooves of the radiation fin support base are formed into a taper shape so as to expand from openings of the grooves toward bottoms thereof, and both sides of each groove bottom are rounded. Accordingly, when the radiation fins are swaged in the grooves, the radiation fins are deformed into an expanded taper shape along the groove shape, and pressed and fixed into the grooves.

CITATION LIST

Patent Literature

Patent Literature 1: JP-A-2001-102786 (page 3, FIG. 8)
Patent Literature 2: JP-A-2002-299864 (page 4, FIGS. 1 and 6)

SUMMARY OF INVENTION

Technical Problem

However, in the technique disclosed in the above-mentioned Patent Literature 1, because the bottoms of the grooves of the radiation fin support base are deformed in a widening direction along a press blade, the radiation fin easily contacts the groove opening, but hardly contacts the groove bottom. As a result, because gaps are liable to be generated between the radiation fins and the grooves, there arises a problem that a thermal resistance between the radiation fins and the radiation fin support base becomes large, and a radiation effect is deteriorated.

Further, in order to fix one radiation fin with the radiation fin support base, the swaging tool needs to broaden two types of grooves, that is, the groove for the radiation fin and the groove for the swaging tool. Therefore, a weight of the swaging tool becomes large. As a result, in order to increase the press weight, a press machine whose frame and motor are large is required. This causes such problems that equipment for swaging the radiation fins in the radiation fin support base becomes large in size, and its facility costs also become high.

Also, in the technique of the above-mentioned Patent Literature 2, there is a need to form the grooves of the radiation fin support base into the taper shape so as to expand from the openings toward the bottoms, and round both sides of each groove bottom. Also, when the radiation fins are swaged in the grooves, the shape of the radiation fin is changed by merely pressing a press blade (press blade) into the radiation fins and using the shape of the grooves. Accordingly, there arise a problem that it is difficult to manage the precision of the pressure by which the radiation fins are pressed for securing the high degree of adhesion of the radiation fins and the grooves, the error of the pressure causes the larger thermal resistance, and the radiation effect is deteriorated.

The present invention has been made in view of the above problems, and aims to provide a radiator in which side gaps between surfaces of radiation fins and a radiation fin support base are eliminated to enlarge contact areas therebetween whereby a thermal resistance between the radiation fins and the radiation fin support base can be reduced to enhance a radiation effect, and a press weight when the radiation fins are swaged in the radiation fin support base can be reduced, and a method of manufacturing the radiator.

Means for Solving the Problem

According to an aspect of the present invention, there is provided a radiator including: a plurality of radiation fins; and a radiation fin support base having a heater element mounted to one surface thereof and a plurality of parallel fin grooves, to which the radiation fins are installed, and a projection, which exposes from a bottom surface of the fin groove by a predetermined height and is configured to fix the radiation fin, formed to the other surface thereof, wherein a top of the projection pushes one side surface of the radiation fin to push the other side surface of the radiation fin toward a side surface of the fin groove, thereby fixing the radiation fin between the top of the projection and the side surface of the fin groove, and wherein the fin groove and the projection are each divided in a plurality of pieces in a longitudinal direction of the fin groove, and each of the divided fin grooves and each of the divided projections have a same length in the longitudinal direction of the fin groove and are paired with each other.

Advantageous Effects of Invention

As described above, according to the radiator and the method of mounting the radiator of the present invention, the projections are tilted toward the radiation fin side, and pushes one side surface of the radiation fin. According to this configuration, the other side surface of the radiation fin is pushed toward a side surface of the fin groove so as to eliminate the gap between the side surface of the radiation fin and the fin groove. As a result, because a contact area of the radiation fin and the radiation fin support base is reduced, a thermal resistance between the radiation fin and the radiation fin support base is reduced, thereby enhancing the radiation effect.

Further, according to the fin groove and the projection each divided in a plurality of pieces in a longitudinal direction of the fin groove, and each of the divided fin grooves and each of the divided projections having a same length in the longitudinal direction of the fin groove and being paired with each other, the respective expansion and contraction amounts of the fin groove and the projection can be reduced even in an environment where the ambient temperature is extremely low. Also, large contact areas of the contact surface of the radiation fin and the side surface of the fin groove and the contact surface of the radiation fin and the top of the projection can be ensured.

DESCRIPTION OF EMBODIMENTS

The embodiment relates to a radiator for efficiently radiating a heat radiated from a heater element used in, for example, a power converting device. The heater element includes, for example, a diode of a converter part that converts an AC into a DC in a power converting device, a bipolar transistor of an inverter part that converts the DC into the AC, and an IGBT, a MOSFET, or a GTO as a switching element. The present invention is not limited to this embodiment.

Figure 1:
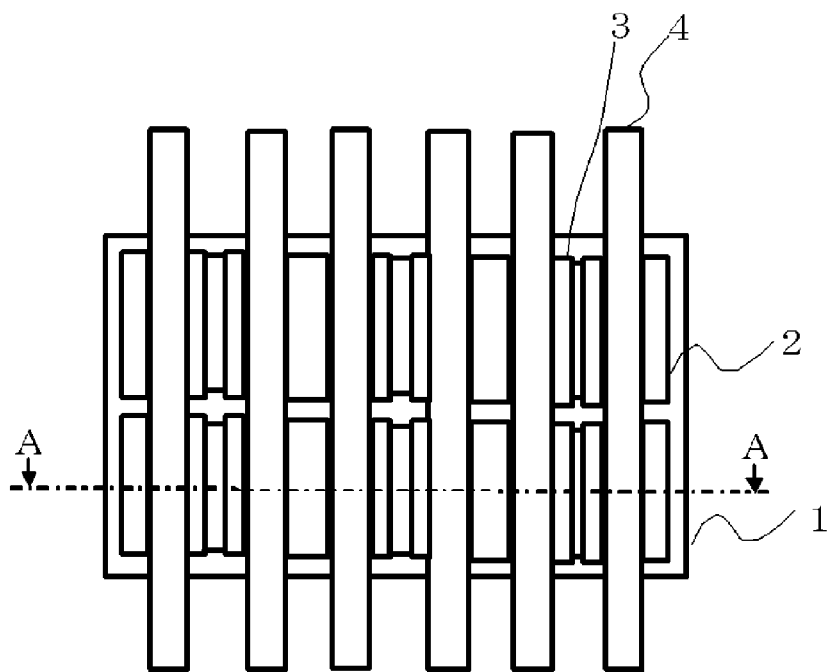
FIG. 1 is a top view illustrating a semiconductor device using a radiator according to the present invention.
Figure 2:
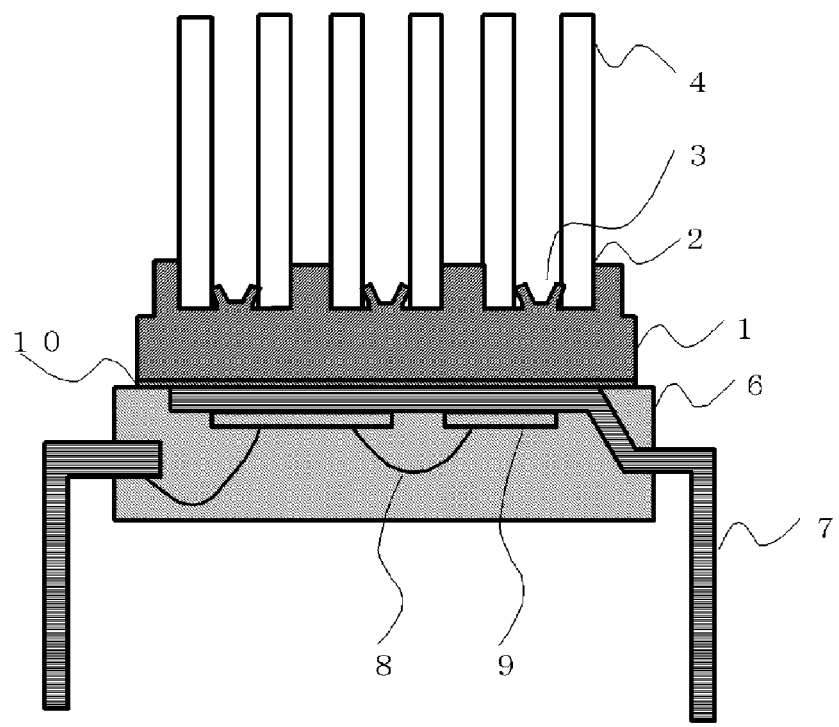
FIG. 2 is a cross-sectional view taken along a line A-A in FIG. 1 in the semiconductor device using a radiator according to the present invention.

FIG. 1 is a top view illustrating a semiconductor device using a radiator according to this embodiment, and FIG. 2 is a cross-sectional view taken along a line A-A of FIG. 1. Referring to FIG. 2, a lead frame 7 is joined to one surface of a radiation fin support base 1 through an insulating resin sheet 10, and the lead frame 7 and the radiation fin support base 1 are electrically insulated from each other. The lead frame 7 is soldered to a heater element 9 with a metal wire. Also, in order to efficiently radiate a heat from the heater element 9, the lead frame 7, the radiation fin support base 1, and radiation fins 4 are formed of a member made of copper or aluminum which is high in thermal conductivity.

Further, a mold resin 6 covers the heater element 9, the lead frame 7, and a metal wire 8, and electrically insulates those respective members from the external. Also, in order to provide an insulation property and a high conductivity, the insulating resin sheet 10 is made of epoxy resin mixed with a filler made of silicon or boron nitride particles. It is preferable that the coefficient of linear thermal expansion of the insulating resin sheet 10 is smaller than the coefficient of linear thermal expansion of the radiation fin support base 1.

Also, the other surface of the radiation fin support base 1 is formed with plural parallel fin grooves 2, and the radiation fins 4 are installed in the fin grooves 2.

First Embodiment

Figure 3:
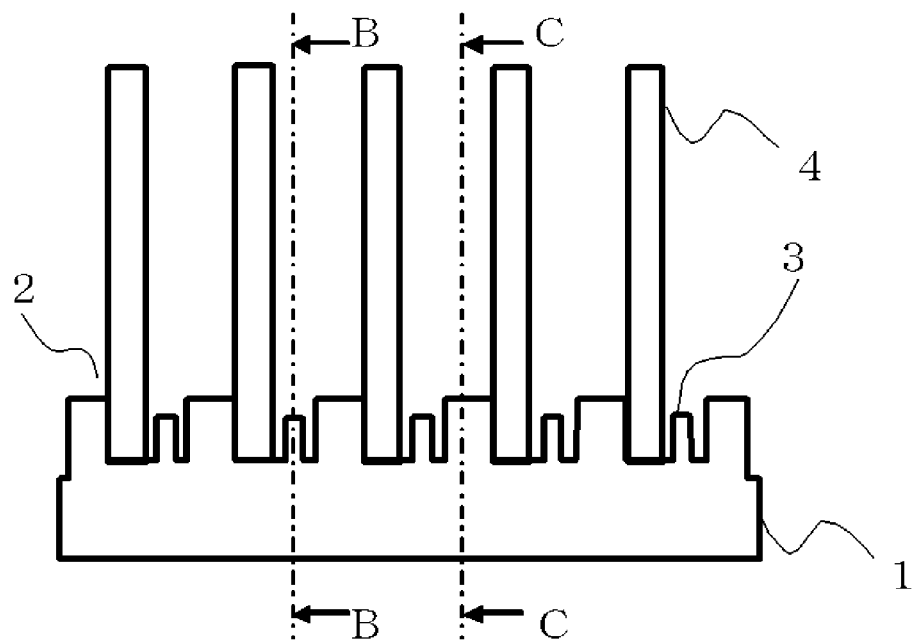
FIG. 3 is a front view illustrating a radiator according to a first embodiment of the present invention.
Figure 3:
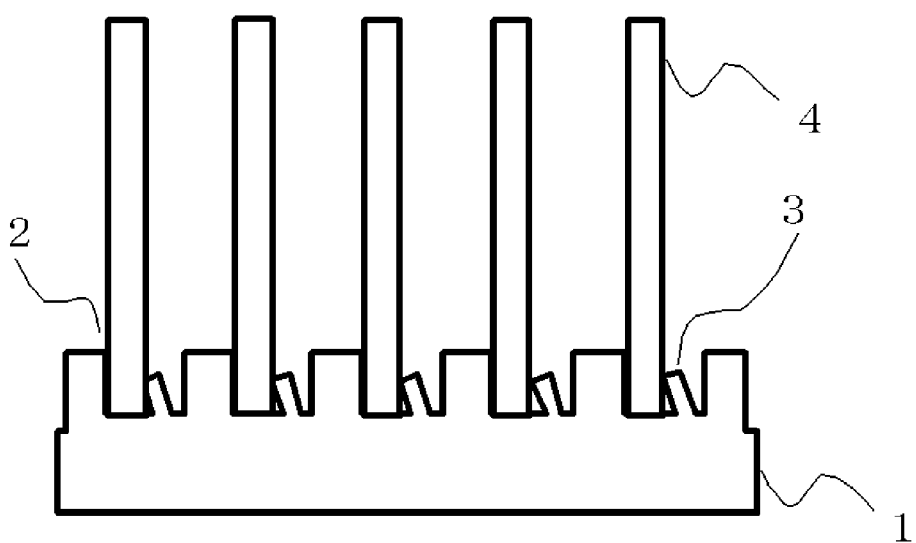

FIG. 3 is a front view illustrating a radiator according to a first embodiment of the present invention. FIG. 3(a) is a diagram illustrating a state in which one of the radiation fins 4 is installed in each of the plural parallel fin grooves 2 formed in the radiation fin support base 1. Also, a first projection 3 having a predetermined height is exposed from a bottom surface of each fin groove 2. In this example, the height of the first projection 3 is configured to be lower than an upper end of each fin groove 2. For that reason, even in a state where the radiation fins 4 is inclined obliquely with respect to a height direction of the fin grooves 2, the radiation fins 4 can be inserted into the fin grooves 2 without any interference with the fin grooves 2 or the first projections 3. This makes it easy to insert the radiation fins 4 in a process of manufacturing the radiator.

Figure 4:
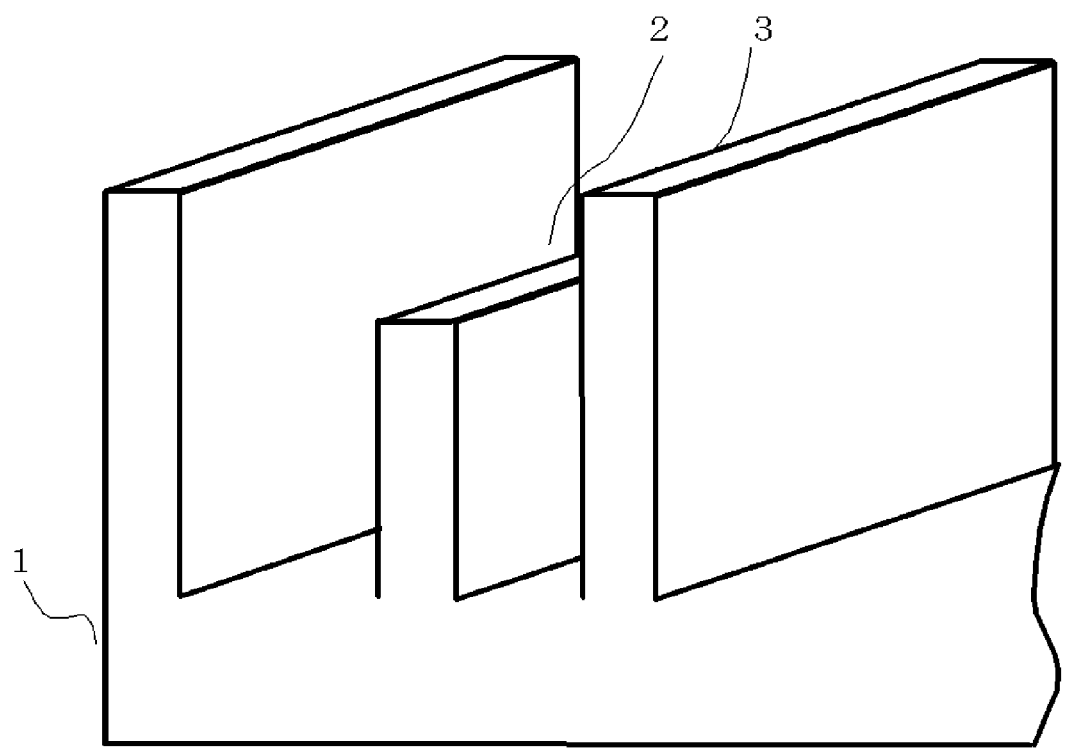
FIG. 4 is a perspective view illustrating a radiation fin support base, fin grooves, and first projections according to the first embodiment of the present invention.

FIG. 3(b) is a diagram illustrating a state in which the first projections 3 are tilted toward the radiation fins 4 side by press work, and each of the radiation fins 4 is swaged between a top of the first projection 3 and a side surface of the fin groove 2. FIG. 4 is a perspective view of the radiation fin support base 1, the fin groove 2, and the first projection 3. In the first embodiment, each of the fin grooves 2 is formed in a cuboidal shape. Also, each of the first projections 3 is formed from the bottom of each fin groove 2 in a cuboidal shape.

Figure 5:
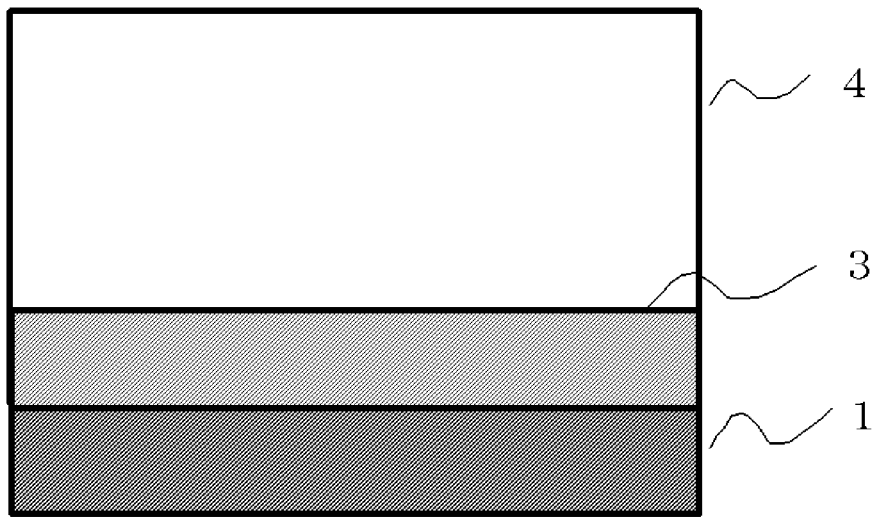
FIG. 5 is a cross-sectional view taken along a line B-B of FIG. 3(a) according to the first embodiment of the present invention.
Figure 6:
FIG. 6 is a cross-sectional view taken along a line C-C of FIG. 3(a) according to the first embodiment of the present invention.

FIG. 5 is a cross-sectional view taken along a line B-B of FIG. 3(a), and FIG. 6 is a cross-sectional view taken along a line C-C of FIG. 3(a). As illustrated in those drawings, in the first embodiment, a longitudinal length of the first projections 3 and a longitudinal length of the fin grooves 2 are identical with a longitudinal length of the radiation fin support base 1.

It is desirable that a method of manufacturing the radiator according to the first embodiment includes the following manufacturing processes. That is, the method undergoes a process of forming the plural parallel fin grooves 2 to one surface of the radiation fin support base 1, the first projections 3 within the respective fin grooves 2 through the die cast molding or the extrusion molding at the same time. Then, the method undergoes a process of installing one radiation fin 4 in each of the fin grooves 2. Thereafter, the method undergoes a process of inserting a press blade 5 between one side surface of the fin groove 2 where the radiation fin 4 is not installed and the first projection 3 and weighting the press blade 5 by a press machine, thereby tilting the first projection 3 toward the radiation fin 4 side, and pushing the top of the first projection 3 against one side surface of the radiation fin 4 to swage the radiation fin. Accordingly, the radiation fin 4 is fixed between the side surface of the fin groove 2 and the top of the first projection 3.

Figure 7:
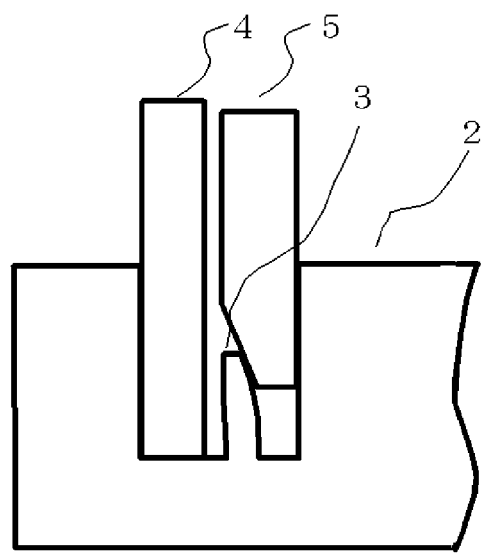
FIG. 7 is a diagram illustrating a process of tilting first projections by using a press blade according to the first embodiment of the present invention.
Figure 7:
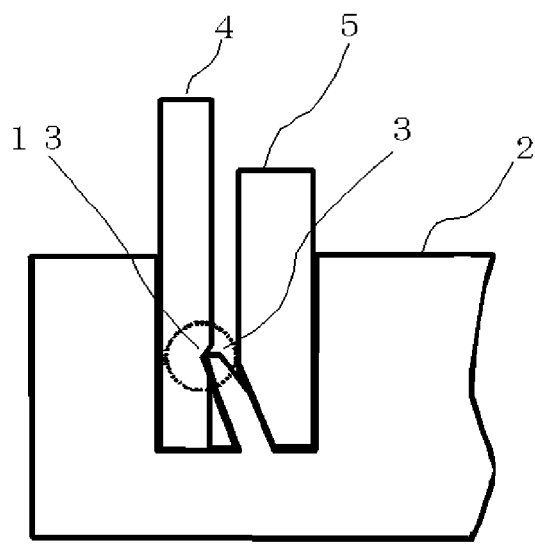
Figure 7:
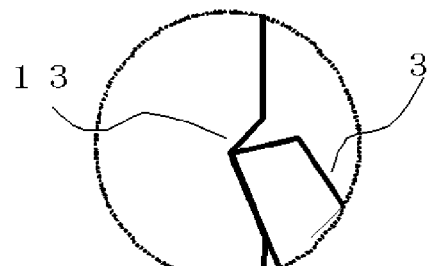

FIG. 7 is a diagram illustrating a process of tilting the first projections 3 by using the press blade 5 among the above processes. In this example, in order to easily inserting the press blade 5 between the first projection 3 and the fin groove 2, it is desirable that the tip of the press blade 5 is shaped so that a width of the press blade 5 is narrowed toward the tip thereof as illustrated in FIG. 7. Also, in order to make it hard to break the press blade 5, and in order to increase a press blade angle, it is desirable to partially flatten the tip of the press blade 5. From the above viewpoints, it is desirable that the press blade 5 is trapezoidally shaped so that the width of the press blade 5 is narrowed toward the tip thereof.

As illustrated in FIG. 7(a), the press blade 5 (or a swaging jig) is inserted between one side surface of the fin groove 2 where the radiation fin 4 is not installed and the first projection 3, and the first projection 3 is tilted toward the radiation fin 4 side. More specifically, as illustrated in FIG. 7(b), the press blade 5 is inserted between one side surface of the fin groove 2 where the radiation fin 4 is not installed and the first projection 3, and then pressed by the press machine. In this example, because the first projections 3 are made of metal large in plasticity such as copper or aluminum, each of the first projections 3 is deformed by pressing through the press machine, and tilted toward the radiation fin 4 side according to the shape of the tip of the press blade 5. Thereafter, the tip of the press blade 5 is abutted against a lower end of the fin groove 2, and stops. With this operation, the top of the first projection 3 presses the radiation fin 4 toward the side surface of the fin groove 2. For that reason, as illustrated in FIG. 7(b), the radiation fin 4 is swaged between the top of the first projection 3 and the side surface of the fin groove 2.

Through the above processes, there can be obtained a radiation fin attaching structure having high adhesion between the radiation fins 4 and the side surfaces of the fin grooves 2. As a result, because large contact areas of the radiation fins 4 with the fin grooves 2 can be ensured, the thermal resistance between the radiation fins and the radiation fin support base can be reduced, thereby enhancing the radiation effect.

Also, in this situation, as illustrated in FIG. 7(c), the top of the first projection 3 is dug into the side surface of the radiation fin 4 while maintaining an uprightness of the radiation fin 4. The shape of the tip of the press blade 5 and the amount of stroke of the press blade are determined in advance so that a depression 13 can be formed to the side surface of the radiation fin 4. This makes it possible to easily manage the amount of tilt of the first projection 3 by the amount of stroke of the press blade 5. Further, it can be easily determined whether the press work has been normally conducted, or not, by visually inspecting the side surface of the radiation fin 4.

The press weight exerted on the press blade 5 when tilting the first projection 3 is a sum of a force component in a direction along which the press blade 5 is advanced and a force component in a perpendicular direction, that is, in a direction of widening a width between the first projection 3 and the fin groove 2. In this case, if an angle of the tip of the press blade 5 to the direction along which the press blade 5 is advanced is obtuse (that is, (force component in the direction along which the press blade 5 is advanced)<(force component in the perpendicular direction)), there has been generally known that the first projections 3 is not tilted from an interface thereof with the radiation fin support base 1, but is deformed toward the radiation fin 4 side from, for example, the tip portion of the first projection 3, that is, buckling distortion. If the first projection 3 performs buckling distortion, because the amount of widening of the width between the fin groove 2 and the first projection 3 is reduced, there is a risk that the radiation fin 4 is not normally swaged.

Under the circumstances, the first projection 3 can be formed in a trapezoidal shape so that the width thereof is increased more from the top toward the bottom. With this configuration, even if the position of the press blade 5 is slightly displaced from between the fin groove 2 and the first projection 3 when the press blade 5 is inserted into the fin groove 2, the first projection 3 can be prevented from performing buckling distortion. As a result, the amount of widening of the width between the fin groove 2 and the first projection 3 can been ensured, and the radiation fin 4 can be normally swaged.

With the above configuration, according to the first embodiment, the press blade 5 (or a swaging jig) is inserted between a side surface of the fin groove 2 where the radiation fin 4 is not installed and the first projection 3, and the first projection 3 is tilted toward the radiation fin 4 side. As a result, the radiation fin 4 is swaged between the top of the first projection 3 and the side surface of the fin groove 2. With this configuration, there can be obtained a radiation fin attaching structure improved in the adhesion of the radiation fins 4 and the side surfaces of the fin grooves 2. As a result, because large contact areas of the radiation fins with the fin grooves can be ensured, the thermal resistance between the radiation fins and the radiation fin support base can be reduced, thereby enhancing the radiation effect.

Second Embodiment

Figure 8:
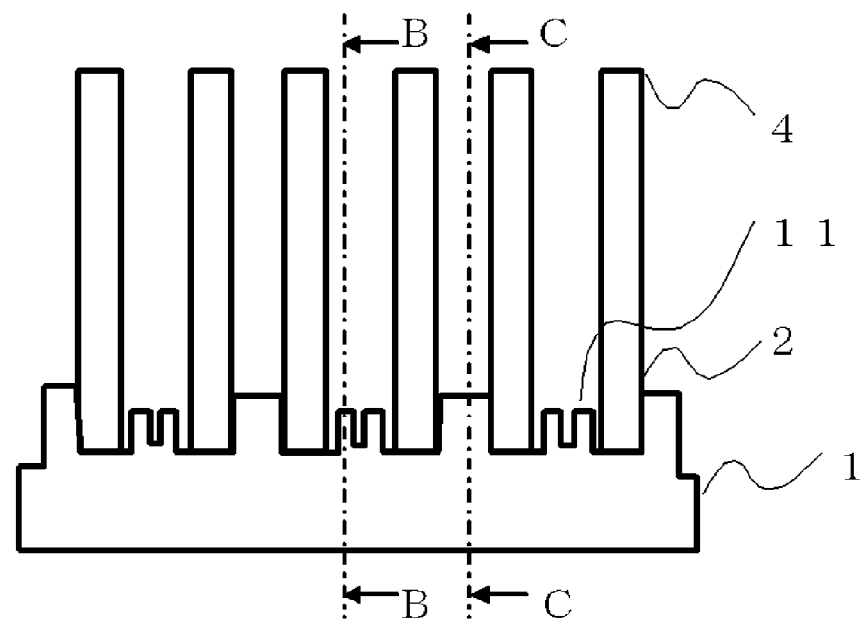
FIG. 8 is a front view illustrating a radiator according to a second embodiment of the present invention.
Figure 8:
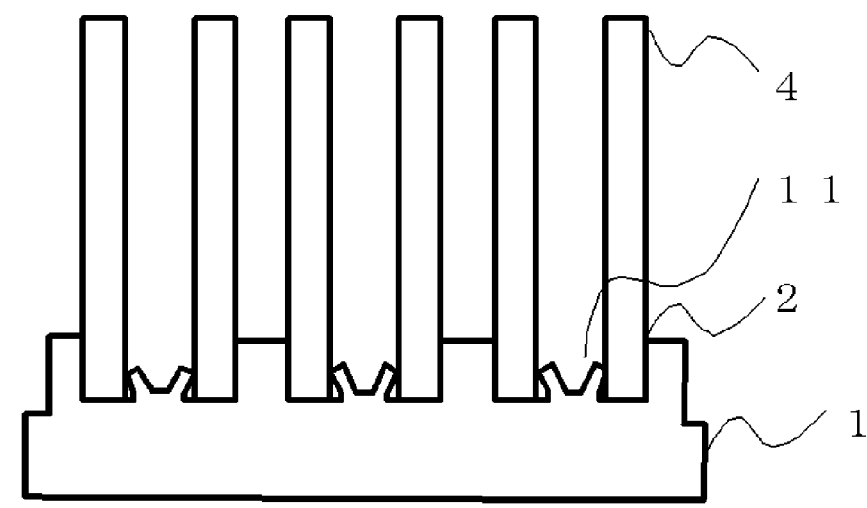

FIG. 8 is a front view illustrating a radiator according to a second embodiment of the present invention. The same configurations as those in FIG. 3 are denoted by identical symbols, and their description will be omitted. Differences from the first embodiment reside in that two radiation fins are installed in one fin groove and in the shape of the projections.

FIG. 8(a) is a diagram illustrating a state in which two radiation fins 4 are installed in each of the plural parallel fin grooves 2 formed in the radiation fin support base 1. Also, a biforked second projection 11 having a predetermined height is exposed from the bottom surface of each fin groove 2 substantially in the center thereof. This embodiment is identical with the first embodiment in that the height of the second projection 11 is configured to be lower than the upper end of each fin groove 2.

Figure 9:
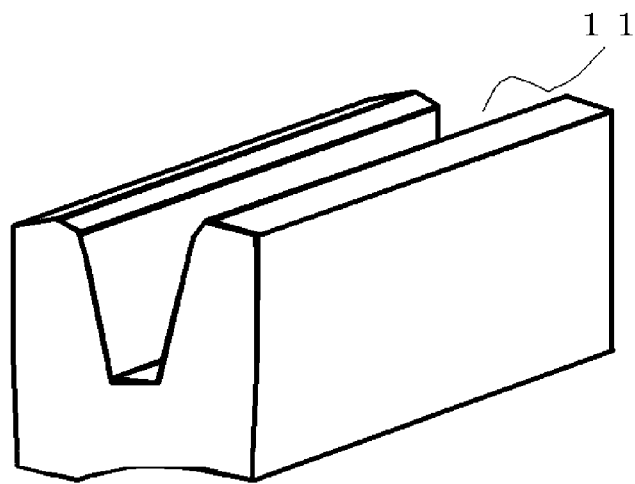
FIG. 9 is a perspective view illustrating second projections according to the second embodiment of the present invention.

Also, FIG. 8(b) is a diagram illustrating a state in which a width of a recess of the biforked tip of the second projection 11 is widened by the press work, and the radiation fin 4 is swaged between the top of the second projection 11 and the side surface of the fin groove 2. FIG. 9 is a perspective view of the second projection 11. In FIG. 9, each shape of the biforked tip portion of the second projection 11 is shaped into such a trapezoid that the width thereof is increased from the top of the second projection 11 toward the bottom. Alternatively, as in the first embodiment, each shape of the biforked tip portion of the second projection 11 may be rectangular.

Figure 10:
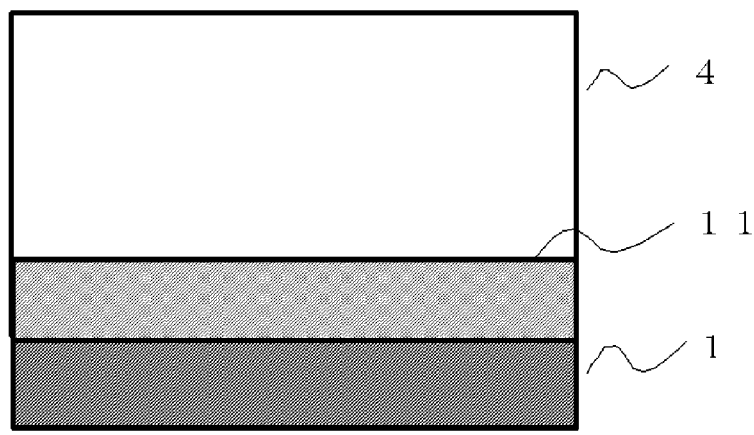
FIG. 10 is a cross-sectional view taken along a line B-B of FIG. 8(a) according to the second embodiment of the present invention.
Figure 11:
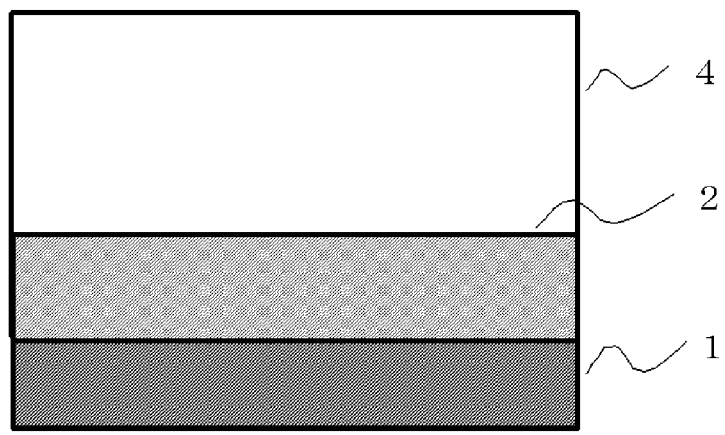
FIG. 11 is a cross-sectional view taken along a line C-C of FIG. 8(a) according to the second embodiment of the present invention.

FIG. 10 is a cross-sectional view taken along a line B-B of FIG. 8(a), and FIG. 11 is a cross-sectional view taken along a line C-C of FIG. 8(a). The same configurations as those in FIGS. 5 and 6 are denoted by identical symbols, and their description will be omitted. From both drawings, in the second embodiment, the respective lengths of the second projections 11 and the fin grooves 2 in a longitudinal direction of the grooves are identical with the length of the radiation fin support base 1 in the longitudinal direction of the grooves.

It is desirable that a method of manufacturing the radiator according to the second embodiment includes the following manufacturing processes. That is, the method undergoes a process of forming the plural parallel fin grooves 2 on one surface of the radiation fin support base 1, and at the same time, forming the second projections 11 within the respective fin grooves 2 so that the tips thereof are biforked. In this example, the radiation fin support base 1, the fin grooves 2, and the second projection 11 are each formed by the die cast molding or the extrusion molding as in the first embodiment. Then, the method undergoes a process of installing two radiation fins in each of the fin grooves 2. Thereafter, the method undergoes a process of inserting the press blade 5 into the recess of the biforked tip of each second projection 11, and weighting the press blade 5 by the press machine, thereby pushing the top of the second projection 11 against one side surface of each radiation fin 4 to swage the radiation fin. Accordingly, each radiation fin 4 is fixed between the side surface of the fin groove 2 and the top of the second projection 11. With the above manufacturing method, in order to fix two radiation fins, only one recess of the tip of the second projection 11 needs to be swaged by the press blade 4 (or swage jig). Therefore, as compared with the conventional art, the number of press blades used in the process of manufacturing the radiator can be reduced. As a result, since the weight when conducting the press work can be reduced, the press machine can be downsized.

Figure 12:
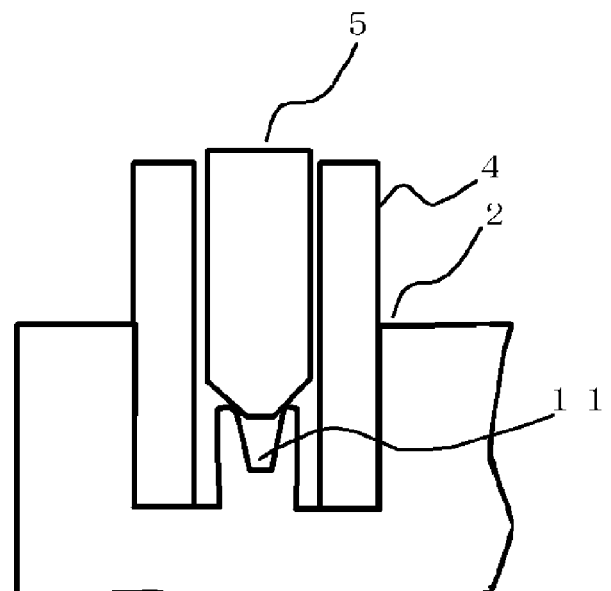
FIG. 12 is a diagram illustrating a process of widening a biforked tip of each second projection by using the press blade according to the second embodiment of the present invention.
Figure 12:
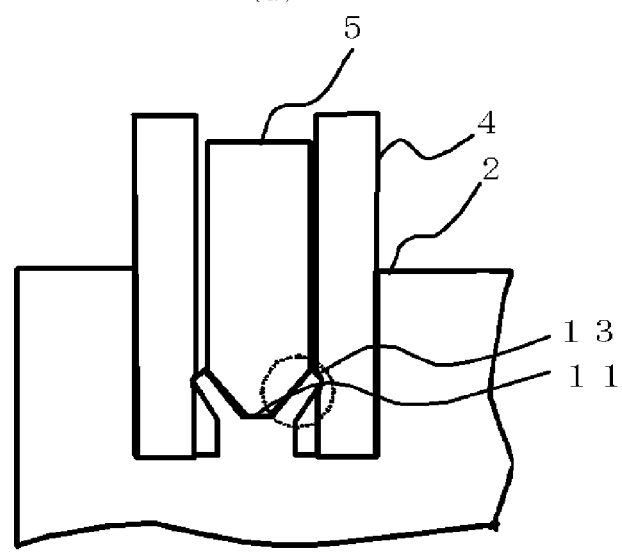
Figure 12:
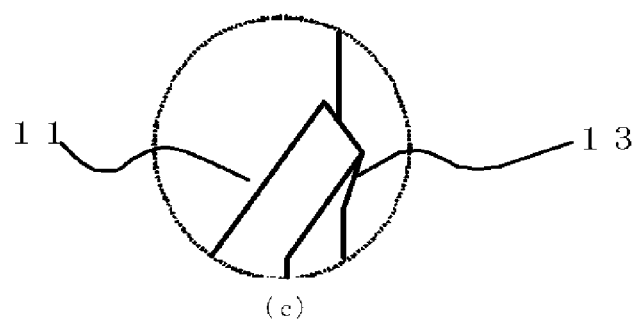

FIG. 12 is a diagram illustrating a process of widening the biforked tip of each second projection 11 by using the press blade 5 among the above processes. The same configurations as those in FIG. 7 are denoted by identical symbols, and their description will be omitted. As illustrated in FIG. 12(a), the press blade 5 (or the swaging jig) is inserted into a recess of the biforked tip of the second projection 11. Thereafter, the press blade 5 is further weighted, and advanced until the press blade 5 is abutted against the bottom of the biforked tip of the second projection 11. In this example, because the second projections 11 are made of metal large in plasticity such as copper or aluminum as with the first projections 3, each of the second projections 11 is deformed, and as illustrated in FIG. 12(b), the width of the tip of the second projection 11 is widened according to the shape of the tip of the press blade 5. As a result, because one top of the biforked second projection 11 pushes the radiation fin 4 against the side surface of the fin groove 2, the radiation fin 4 is swaged between the top of the first projection 3 and the side surface of the fin groove 2. With the above configuration, there can be obtained a radiation fin attaching structure improved in the adhesion of the radiation fins 4 and the side surfaces of the fin grooves 2. As a result, because large contact areas of the radiation fins 4 with the fin grooves 2 can be ensured, the thermal resistance between the radiation fins and the radiation fin support base can be reduced, thereby enhancing the radiation effect.

Also, as described above, when the tip of the press blade 5 is abutted against a bottom of the biforked tip of the second projection 11 and stops, as illustrated in FIG. 12(c), the top of the second projection 11 is dug into the side surface of the radiation fin 4 while maintaining an uprightness of the radiation fin 4. The shape of the tip of the press blade 5 and the amount of stroke of the press blade are determined in advance so that the depression 13 can be formed to the side surface of the radiation fin 4. This makes it possible to easily manage the amount of widening of the width of the biforked tip of the second projection 11 by the amount of stroke of the press blade 5. Further, it can be easily determined whether the press work has been normally conducted, or not, by visually inspecting the side surface of the radiation fin 4.

With the above configuration, according to the second embodiment, the press blade 5 (or the swaging jig) is inserted into the recess of the biforked tip of the second projection 11, and the width of the tip of the second projection 11 is widened so that one top of the biforked second projection 11 pushes the radiation fin 4 against the side surface of the fin groove 2. Therefore, the radiation fin 4 is swaged between the top of the first projection 3 and the side surface of the fin groove 2. With this configuration, there can be obtained a radiation fin attaching structure improved in the adhesion of the radiation fins 4 and the side surfaces of the fin grooves 2. As a result, because large contact areas of the radiation fins 4 with the fin grooves 2 can be ensured, the thermal resistance between the radiation fins and the radiation fin support base can be reduced, thereby enhancing the radiation effect.

Further, when the above two radiation fins 4 are swaged between the tops of the second projection 11 and the side surfaces of the fin groove 2, only one portion of the recess of the biforked tip of the second projection 11 needs to be swaged by the press blade 4 (or the swage jig). As a result, as compared with the conventional art, the number of press blades used in the process of manufacturing the radiator can be reduced. As a result, since the weight when conducting the press work can be reduced, the press machine can be downsized.

In the second embodiment, the biforked tip is used as the second projection 11, but instead of the above configuration, two of the first projections 3 used in the first embodiment may be arranged substantially at the center of the fin groove 3.

Third Embodiment

In the first embodiment and the second embodiment, the respective lengths of the first projections 3, the second projections 11, and the fin grooves 2 in the longitudinal direction of the grooves are identical with the length of the radiation fin support base 1 in the longitudinal direction of the grooves, and the respective members are successively formed. In a third embodiment, for example, the first projections 3 and the fin grooves 2 in the first embodiment are divided in the longitudinal direction of the grooves, and the divided first projections 3 and the divided fin grooves 2 each having the same length are paired.

Figure 13:
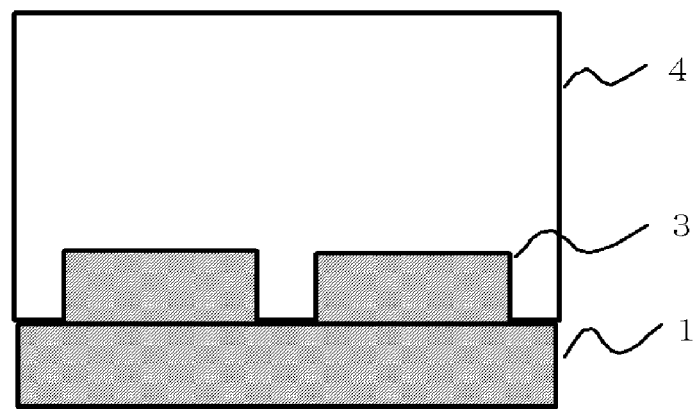
FIG. 13 is a cross-sectional view taken along a line B-B of FIG. 3(a) according to a third embodiment of the present invention.
Figure 14:
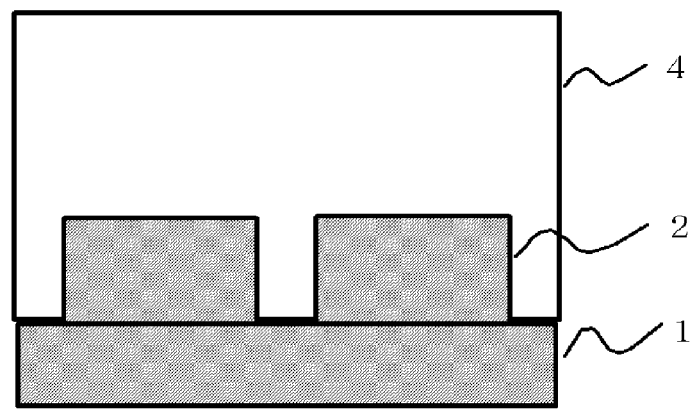
FIG. 14 is a cross-sectional view taken along a line C-C of FIG. 3(a) according to the third embodiment of the present invention.

FIG. 13 is a cross-sectional view taken along a line B-B of FIG. 3(a), and FIG. 14 is a cross-sectional view taken along a line C-C of FIG. 3(a). The same configurations as those in FIGS. 5 and 6 are indicated by identical symbols, and their description will be omitted. From those drawings, in the third embodiment, the first projections 3 and the fin grooves 2 are each divided into two pieces in the longitudinal direction of the grooves, and the divided first projections 3 and the divided fin grooves 2 each having the same length are paired with each other.

In the third embodiment, if the first projections 3 and the fin grooves 2 are formed by die cast molding, the divided surfaces of the first projections 3 and the fin grooves 2 are formed by a die as with the first projections 3 and the fin grooves 2. On the other hand, when the first projections 3 and the fin grooves 2 are formed by the extrusion molding, the divided surfaces are formed by a cutting work after molding.

Particularly under an environment in which an ambient temperature is extremely low, a stress is applied to a contact surface of each radiation fin 4 and the side surface of each fin groove 2 and a contact surface of each radiation fin 4 and the top of each first projection 3 due to respective linear expansion differences of the fin grooves 2, the first projections 3, and the radiation fins 4. In particular, when the lengths of the fin grooves 2 and the first projections 3 are long as in the first embodiment and the second embodiment, because an absolute value of expansion and contraction amount becomes large, the stress is increased. As a result, the fin grooves 2, the first projections 3, or the radiation fins 4 are deformed, and the contact surface of each radiation fin 4 and the side surface of each fin groove 2 and the contact surface of each radiation fin 4 and the top of each first projection 3 become smaller in contact area. This makes a thermal resistance between the radiation fins 4 and the fin grooves 2 larger, resulting in a risk that the radiation effect is deteriorated.

On the other hand, in the third embodiment, each of the fin groove 2 and the first projection 3 is divided into two pieces in the longitudinal direction of the groove whereby a length of each of the fin groove and the projection is shortened. As a result, the respective expansion and contraction amounts can be reduced to decrease the absolute value of the stress. With the above configuration, even in an environment where the ambient temperature is extremely low, the large contact areas of the contact surface of each radiation fin 4 and the side surface of each fin groove 2 and the contact surface of each radiation fin 4 and the top of each first projection 3 can be ensured. This makes it possible to prevent the thermal resistance between the radiation fins 4 and the fin grooves 2 under the above environment from increasing.

Further, when the first projection 3 is divided into two pieces, because the weight necessary when subjecting the first projections 3 to the press work becomes small as described above, the press weight can be further reduced.

With the above configuration, according to the third embodiment, when the fin grooves 2 and the first projections 3 are each divided into two pieces in the longitudinal direction of the grooves, the respective expansion and contraction amounts of the fin grooves 2 and the first projections 3 can be reduced even in the environment where the ambient temperature is extremely low. Also, the large contact areas of the contact surface of each radiation fin 4 and the side surface of each fin groove 2 and the contact surface of each radiation fin 4 and the top of each first projection 3 can be ensured. For that reason, the thermal resistance between the radiation fins 4 and the fin grooves 2 under the above environment can be prevented from increasing.

Fourth Embodiment

In the third embodiment, the fin grooves 2 and the first projections 3 are each divided into two pieces in the longitudinal direction of the grooves. However, each of the fin grooves 2 and the first projections 3 can be divided into, for example, three pieces in the longitudinal direction of the grooves. Further, the respective lengths of the divided fin grooves and projections can be changed.

Figure 15:
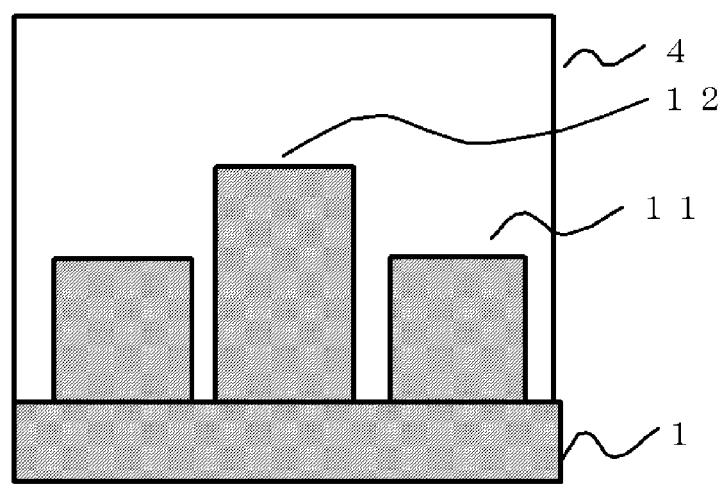
FIG. 15 is a cross-sectional view taken along the line B-B of FIG. 8(a) according to a fourth embodiment of the present invention.
Figure 16:
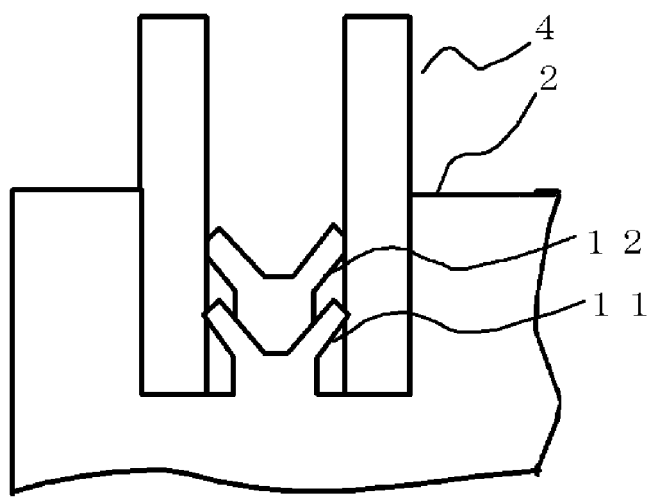
FIG. 16 is a diagram illustrating a part of a front view of a radiator according to the fourth embodiment of the present invention.

FIG. 15 is a cross-sectional view taken along the line B-B of FIG. 8(a), and FIG. 16 is a diagram illustrating a part of a front view of a radiator according to the fourth embodiment. The same configurations as those in FIGS. 8 and 12 are indicated by identical symbols, and their description will be omitted. From FIG. 15, in the fourth embodiment, the fin grooves 2 are each divided into three pieces in the longitudinal direction of the grooves. The second projections 11 having the same length as that of the fin grooves arranged at both ends of the radiation fin support base 1 among the divided fin grooves 2 is paired with those fin grooves. Also, a third projection 12 having the same length as that of the fin groove 2 arranged at the center of the radiation fin support base 1 among the divided fin grooves 2 is paired with the fin groove 2. Further, the third projection 12 is higher in height than the second projections 11. As a result, as illustrated in FIG. 16, each radiation fin 4 is fixed by projections different in height such as the second projections 11 and the third projection 12.

In this example, when the radiation fin 4 is inserted between the fin groove 2 and the second projection 11 and the top of the second projection 11 is press-weighted, the amount of widening of the width of the recess formed to the tip of the second projection 11 is changed due to warpage or dimensional variation of the radiation fin support base 1 or displacement of the press blade. For example, if the amount of widening of the width of the tip of the second projection 11 is large, the radiation fin 4 will be deformed into a shape like a hiragana "ku" toward the second projection 11 side with the top of the second projection 11 as a base point. As a result, because the contact area of the side surface of the radiation fin 4 and the side surface of the fin groove 2 is reduced, the thermal resistance between the radiation fin 4 and the fin groove 2 becomes large, resulting in a risk that the radiation effect is deteriorated.

On the other hand, in the fourth embodiment, the heights of those three fin grooves 2 are identical with each other. However, the height of the third projection 12 arranged in the center of the radiation fin support base 1 is set to be higher than the height of the second projections 11 arranged at both ends of the radiation fin support base 1. The second projections 11 and the third projection 12 swage the radiation fin 4 at respective different positions in the height direction of the radiation fin. For that reason, a stress exerted on the contact surface of the radiation fin 4 with the projection is dispersed on contact areas thereof with the tops of the second projections 11 and the top of the third projection 12, and the radiation fin 4 can be prevented from being deformed into the shape like a hiragana "ku".

Also, when the radiation fin 4 is inserted between the second projections 11 and the third projection 12 and the fin grooves 2, after the radiation fin 4 is inserted between the third projection 12 higher in the height and the fin groove 2, the radiation fin 4 is inserted between the second projections 11 lower in the height and the fin grooves 2. That is, the radiation fins 4 is inserted between the second projections 11 and the fin grooves 2 in a state where a backlash is suppressed between the third projection 12 and the fin groove 2. As a result, the radiation fin 4 can be easily inserted between the second projections 11 and the third projection 12 and the fin grooves 2. In particular, when the radiation fin 4 is long, when the radiation fin 4 is inserted between the second projections 11 and the third projection 12 and the fin grooves 2, the radiation fin 4 is tilted, thereby making it difficult to insert the radiation fin 4 between the second projections 11 at both ends of the radiation fin support base. However, according to the fourth embodiment, because the presence of the third projection 12 higher in height can prevent the radiation fin 4 from being tilted as described above, the radiation fin 4 can be easily inserted between the second projections 11 and the third projection 12 and the fin grooves 2.

Further, in the process of manufacturing the radiator, after the radiation fins 4 are inserted between the second projections 11 and the third projection 12 and the fin grooves 2, the radiator is transported. In this situation, because the height of the third projection 12 is higher, the radiation fins 4 can be prevented from being tilted or falling at the time of transporting the radiator.

With the above configuration, according to the fourth embodiment, each of the fin grooves 2 is divided into three pieces in the longitudinal direction of the groove, and the second projections 11 lower in the height having the same length as that of the fin grooves arranged at both ends of the radiation fin support base 1 among the divided fin grooves 2 is paired with those fin grooves. Also, the third projection 12 higher in the height having the same length as that of the fin groove 2 arranged at the center of the radiation fin support base 1 among the divided fin grooves 2 is paired with the fin groove 2. As a result, each radiation fin 4 is more surely fixed by the second projections 11 and the third projection 12 and the fin groove 2.

Figure 17:
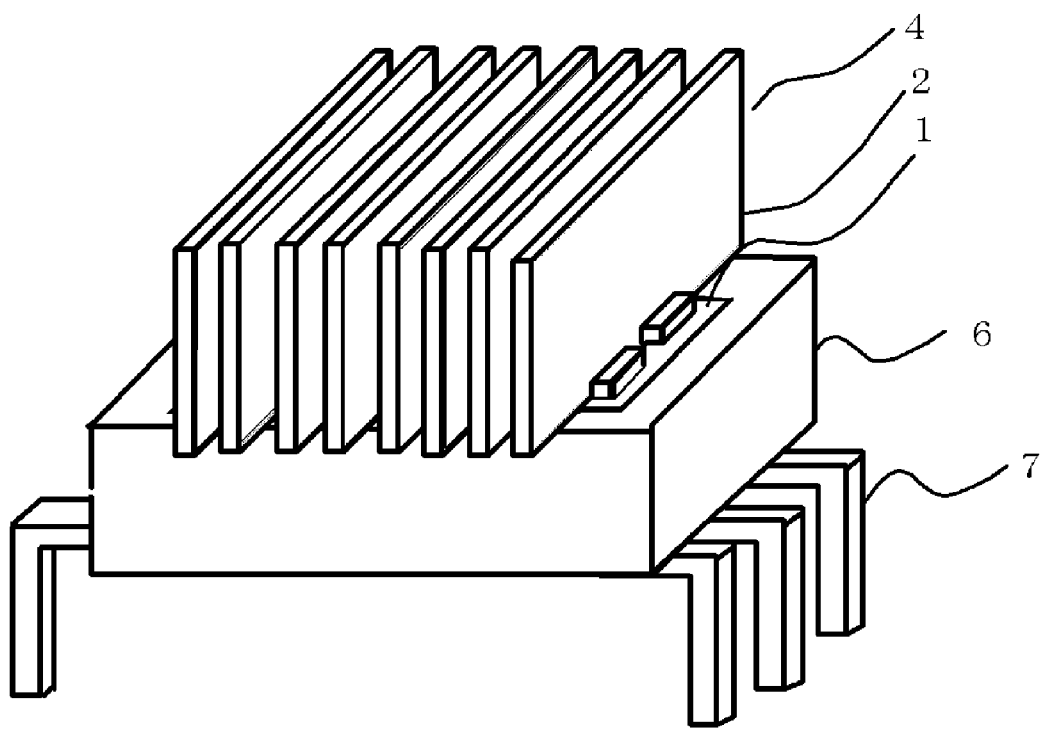
FIG. 17 is a perspective view illustrating the semiconductor device using the radiator according to the present invention.
Figure 18:
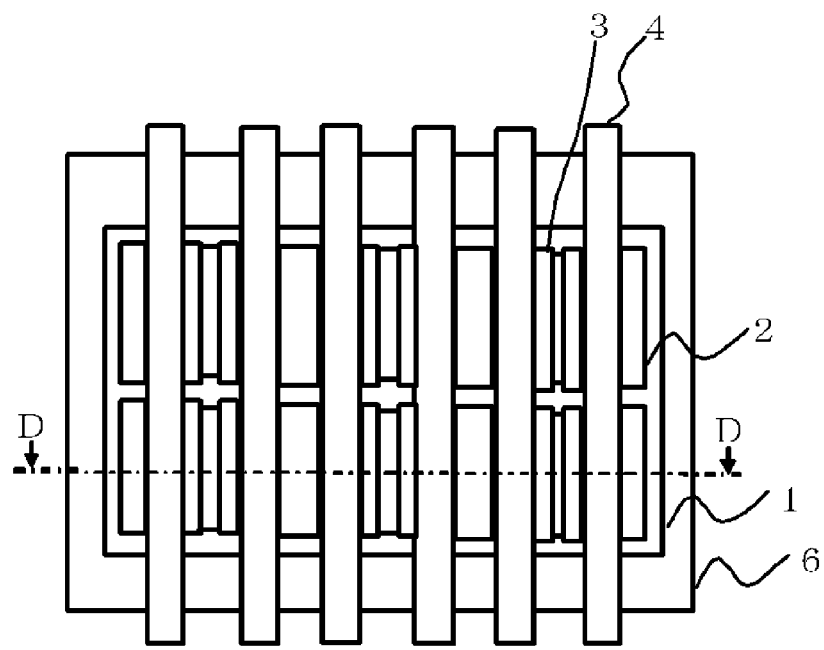
FIG. 18 is a top view illustrating the semiconductor device using the radiator according to the present invention.
Figure 19:
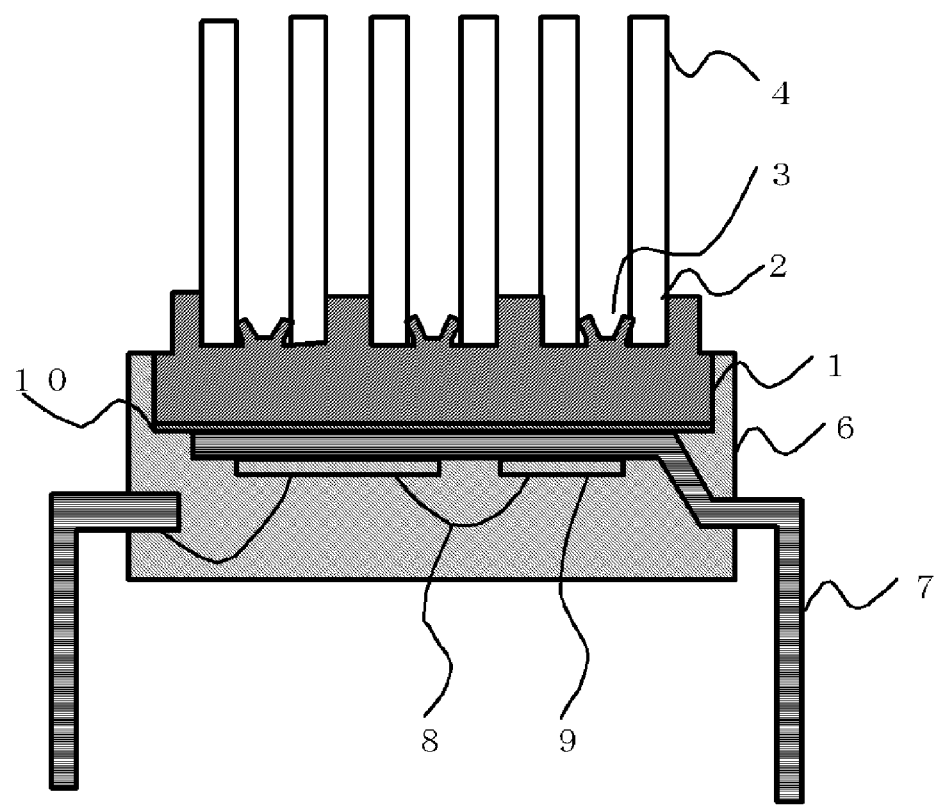
FIG. 19 is a cross-sectional view taken along a line D-D of FIG. 18 in the semiconductor device using the radiator according to the present invention.

One example of a semiconductor device using the radiator according to the first to fourth embodiments will be described hereinafter. FIG. 17 is a perspective view illustrating the semiconductor device, and FIG. 18 is a top view illustrating the semiconductor device. FIG. 19 is a cross-sectional view taken along a line D-D of FIG. 18. The same configurations as those in FIG. 8 are indicated by identical symbols, and their description will be omitted.

In the semiconductor device, the radiation fin support base 1 covered with a mold resin 6 at the side surface and the bottom surface thereof and the radiation fins 4 are individualized. With this configuration, because a fin length of the radiation fins 4 can be made longer than a length of the mold resin 6 in a longitudinal direction of the radiation fins 4, and a fin pitch between the adjacent radiation fins can be narrowed, an installation area of the semiconductor device can be reduced. Also, since a total of the surface areas of the radiation fins 4 in the semiconductor device can be increased, the radiation effect can be enlarged. As a result, for example, an element that is small in an absolute maximum rating of a junction temperature can be selected as the heater element 9, thereby making it possible to downsize the heater element and reduce the costs.

Also, the side surface and the bottom surface of the radiation fin support base 1 are covered with the mold resin 6. The radiation fin support base 1 is formed by the die cast molding or the extrusion molding as described above, and therefore the radiation fin support base 1 may be warped or swelled. In addition, the radiation fin support base 1 may be expanded and further deformed due to a change in the ambient temperature. For the above reasons, there is a risk that a force for pressing the radiation fins 4 toward the fin grooves 2 is decreased, and the thermal resistance between the radiation fins 4 and the fin grooves 2 is increased to deteriorate the radiation property.

On the other hand, the side surface and the bottom surface of the radiation fin support base 1 are covered with the mold resin 6. Therefore, the side surface and the bottom surface of the radiation fin support base 1 can be held so as to prevent the radiation fin support base 1 from being expanded and deformed. As a result, the force for pressing the radiation fins 4 toward the fin grooves 2 can be prevented from being decreased, and the radiation property can be prevented from being deteriorated.

REFERENCE SIGNS LIST 1 radiation fin support base
2 fin groove
3 first projection
4 radiation fin
5 press blade
9 heater element
11 second projection
12 third projection

The invention claimed is:
1. A radiator comprising:
a plurality of radiation fins; and
a radiation fin support base having a heater element mounted to one surface thereof and a plurality of parallel fin grooves, in which the radiation fins are installed, and a projection, which projects from a bottom surface of one of the plurality of fin grooves by a predetermined height and is configured to fix one of the plurality of radiation fins, formed on the other surface thereof,
wherein a top of the projection is dug into one side surface of the radiation fin such that a side of the top of the projection is parallel to and contacting a recessed portion of the one side surface to thereby push the other side surface of the radiation fin toward a side surface of the fin groove, thereby fixing the radiation fin between the top of the projection the side surface of the fin groove, and
wherein the fin groove and the projection are each divided in a plurality of pieces in a longitudinal direction of the fin groove, and each of the divided fin grooves and each of the divided projections have a same length in the longitudinal direction of the fin groove and are paired with each other, and wherein the divided projections have different heights.

2. A radiator comprising:
a plurality of radiation fins; and
a radiation fin support base having a heater element mounted to one surface thereof and a plurality of parallel fin grooves, in which the radiation fins are installed, and a projection, which projects from a bottom surface of one of the plurality of fin grooves by a predetermined height and is configured to fix one of the plurality of radiation fins, formed on the other surface thereof,
wherein a top of the projection is dug into one side surface of the radiation fin such that a side of the top of the projection is parallel to and contacting a recessed portion of the one side surface to thereby push the other side surface of the radiation fin toward a side surface of the fin groove, thereby fixing the radiation fin between the top of the projection and the side surface of the fin groove,
wherein the fin groove and the projection are each divided in a plurality of pieces in a longitudinal direction of the fin groove, and each of the divided fin grooves and each of the divided projections have a same length in the longitudinal direction of the fin groove and are paired with each other,
wherein the projection is divided in at least three pieces, and
wherein, among the divided projections, a height of the projection arranged at a center of the radiation fin support base is higher than a height of the projections arranged at both ends of the radiation fin support base.

* * * * *